United States Patent
Liu et al.

(10) Patent No.: US 8,130,587 B1
(45) Date of Patent: Mar. 6, 2012

(54) EFFICIENT METHOD OF REPLICATE MEMORY DATA WITH VIRTUAL PORT SOLUTION

(75) Inventors: Zhen Liu, Redwood City, CA (US); Uma Durairajan, Redwood City, CA (US); Kenway Tam, Redwood City, CA (US)

(73) Assignee: Oracle International Corporation, Redwood City, CA (US)

( * ) Notice: Subject to any disclaimer, the term of this patent is extended or adjusted under 35 U.S.C. 154(b) by 18 days.

(21) Appl. No.: 12/871,450

(22) Filed: Aug. 30, 2010

(51) Int. Cl.
*G11C 8/00* (2006.01)
*G11C 7/00* (2006.01)
*G11C 7/10* (2006.01)

(52) U.S. Cl. ......... 365/230.05; 365/189.04; 365/189.15; 365/230.06

(58) Field of Classification Search ............. 365/230.05
See application file for complete search history.

(56) References Cited

U.S. PATENT DOCUMENTS

| | | | |
|---|---|---|---|
| 5,781,480 A * | 7/1998 | Nogle et al. | 365/189.04 |
| 7,088,638 B1 * | 8/2006 | Bunce et al. | 365/194 |
| 7,349,285 B2 * | 3/2008 | Balasubramanian et al. | 365/230.05 |
| 7,626,878 B1 * | 12/2009 | Lin et al. | 365/207 |
| 7,643,330 B1 * | 1/2010 | Lin et al. | 365/154 |
| 7,693,002 B2 * | 4/2010 | Lin | 365/230.06 |
| 7,817,492 B2 * | 10/2010 | Kanari | 365/230.05 |
| 7,940,599 B2 * | 5/2011 | Lu et al. | 365/230.05 |
| 2005/0024975 A1 * | 2/2005 | Gratrex et al. | 365/230.05 |

* cited by examiner

*Primary Examiner* — Son Mai
(74) *Attorney, Agent, or Firm* — Osha • Liang LLP

(57) ABSTRACT

A hardware arrangement for a memory bitcell, including a primary decoder for decoding a common memory address portion among a plurality of memory addresses, and a plurality of secondary decoders each for decoding an uncommon memory address portion of each of the plurality of memory addresses. The memory bitcell is configured to receive the decoded common memory address portion and output data from a memory entry corresponding to the decoded common memory address portion, and includes a single read port for outputting the data. The hardware arrangement includes a modified sense amplifier (SA) configured to receive the data output on the single read port, and directly receive the plurality of decoded uncommon memory address portions. The plurality of decoded uncommon memory address portions is used to determine whether to enable the modified SA. Data output from the memory bitcell is forwarded when the modified SA is enabled.

11 Claims, 5 Drawing Sheets

US 8,130,587 B1

EFFICIENT METHOD OF REPLICATE MEMORY DATA WITH VIRTUAL PORT SOLUTION

BACKGROUND

Static random access memory (SRAM) is a type of semiconductor memory that is volatile but static (i.e., does not have to be refreshed periodically, but still loses data when power is removed). Each bit in an SRAM is stored on four transistors that form two cross-coupled inverters. This storage cell has two stable states which are used to denote 0 and 1. Two additional access transistors serve to control the access to a storage cell during read and write operations. A typical SRAM uses six MOSFETs to store each memory bit. Access to the SRAM bitcell is enabled by a word line which controls two access transistors which, in turn, control whether the cell should be connected to the bit lines. Bit lines are used to transfer data for both read and write operations. More ports can be added to the basic SRAM cell when multiple data needs to be accessed at the same time.

FIG. 1 shows a schematic diagram for a traditional SRAM memory cell implementation with 3 read ports (read ports 0-2). Typically, to determine the address range that each processor or device is mapped to, memory addresses are decoded using decoders (100, 102, 104). Each output of the decoders (100, 102, 104) is sent to the memory bitcell (106) for selection of physical memory addresses. Thus, for example, in FIG. 1, there are three addresses, address0, address1, and address2, each with a common address portion (address_common) that are decoded and sent to the memory bitcell (106). The common address portion is a fixed number of bits of the memory address that are identical in each memory address. The memory bitcell (106) includes three wordlines 0-2 to receive the three decoded memory addresses.

As can be seen in the schematic, the memory bitcell (106) includes bitcell logic (108). The bitcell logic (108) includes the transistors and cross-coupled inverters of a typical SRAM bitcell described above. Using this bitcell logic (108), the memory bitcell (106) is configured to output the physical memory addresses to be read on each of the read ports 0-2. These outputted physical memory addresses are amplified by the local sense amplifier (LSA) (110). Due to large arrays of SRAM memory bitcells, the resulting signal, in the event of a read operation, has a much lower voltage swing. To compensate for that swing the LSA (110) is used to amplify voltage coming out of the read ports (bitlines) of the memory bitcell (106). Thus, the multi-port SRAM of FIG. 1 has three read ports corresponding to the wordlines 0-2 and a common address portion for each of the ports on which memory address data is output.

SUMMARY

In general, in one aspect, the invention relates to a hardware arrangement for a memory bitcell, comprising a primary decoder configured to decode a common memory address portion among a plurality of memory addresses to obtain a decoded common memory address portion, a plurality of secondary decoders each configured to decode an uncommon memory address portion of each of the plurality of memory addresses to obtain a plurality of decoded uncommon memory address portions, the memory bitcell configured to receive the decoded common memory address portion and output data from a memory entry corresponding to the decoded common memory address portion, wherein the memory bitcell comprises a single read port for outputting the data; and a modified sense amplifier (SA) configured to receive the data output on the single read port of the memory bitcell, and directly receive the plurality of decoded uncommon memory address portions, wherein the plurality of decoded uncommon memory address portions is used to determine whether to enable the modified SA, wherein the data output from the memory bitcell is forwarded by the modified SA when the modified SA is enabled.

In general, in one aspect, the invention relates to a method for reading memory, comprising performing hierarchical decoding of common address portion and uncommon address portions of a plurality of memory addresses to obtain a decoded common address portion and a plurality of decoded uncommon address portions of each of the plurality of memory addresses from which data is to be read, sending the decoded common address portion to a memory bitcell, obtaining data from a memory bitcell entry corresponding to the decoded common memory address portion, wherein the data is output via a single read port of the memory bitcell, sending the data and the decoded uncommon address portions to a modified sense amplifier (SA), and determining whether the modified SA is enabled to output the data using the plurality of uncommon address portions.

DETAILED DESCRIPTION

Figure 1:
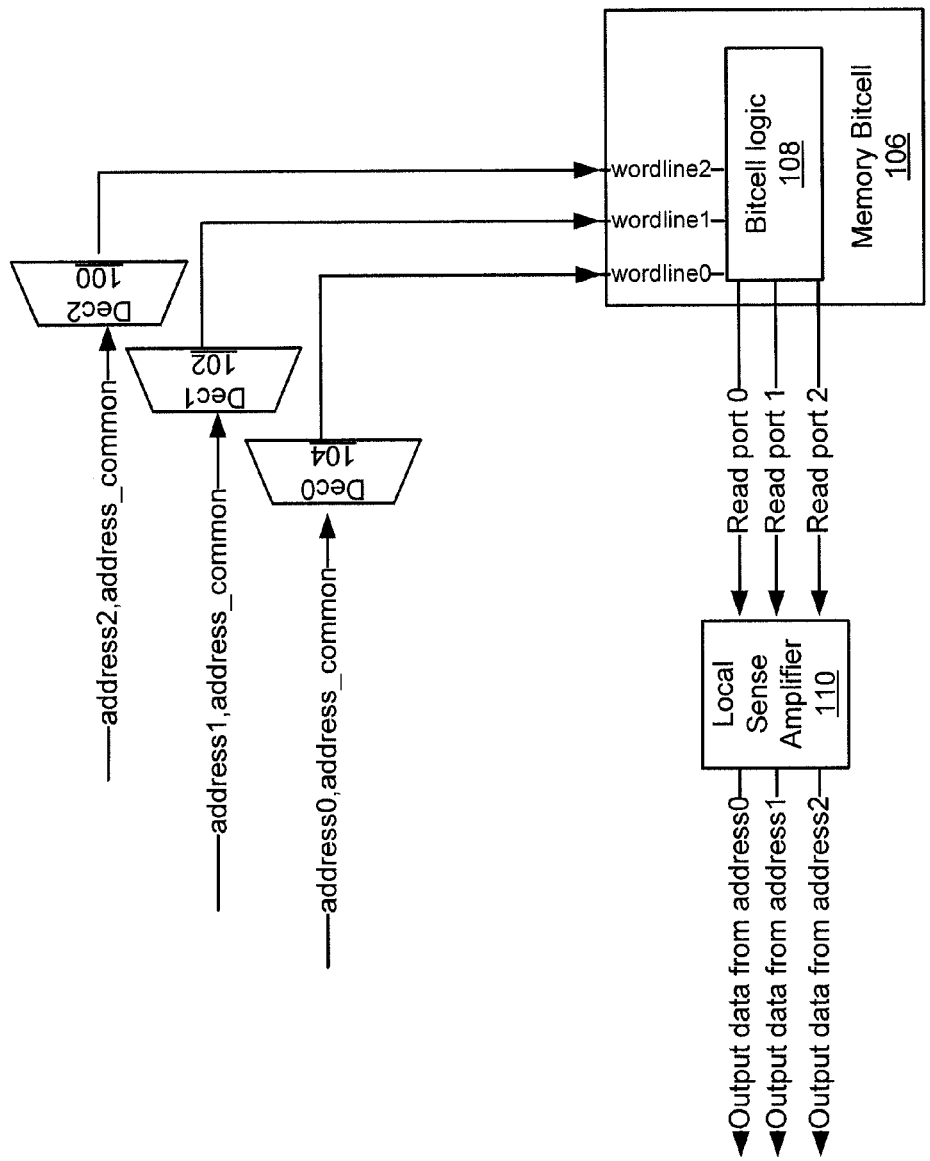
FIG. 1 shows a schematic diagram for a SRAM memory cell as is known in the art.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a hardware memory arrangement that requires a fewer number of read ports for a multi-port memory bitcell. Specifically, embodiments of the invention utilize hierarchical decoding of memory addresses and a modified local sense amplifier to select appropriate register bank output data, resulting in a fewer number of read ports required by each memory bitcell/register bank. Those skilled in the art will appreciate that throughout the remainder of this disclosure, the terms "memory bitcell" and "register bank" are used interchangeably, but refer to the same hardware (i.e., a subbank of a memory chip).

Figure 2:
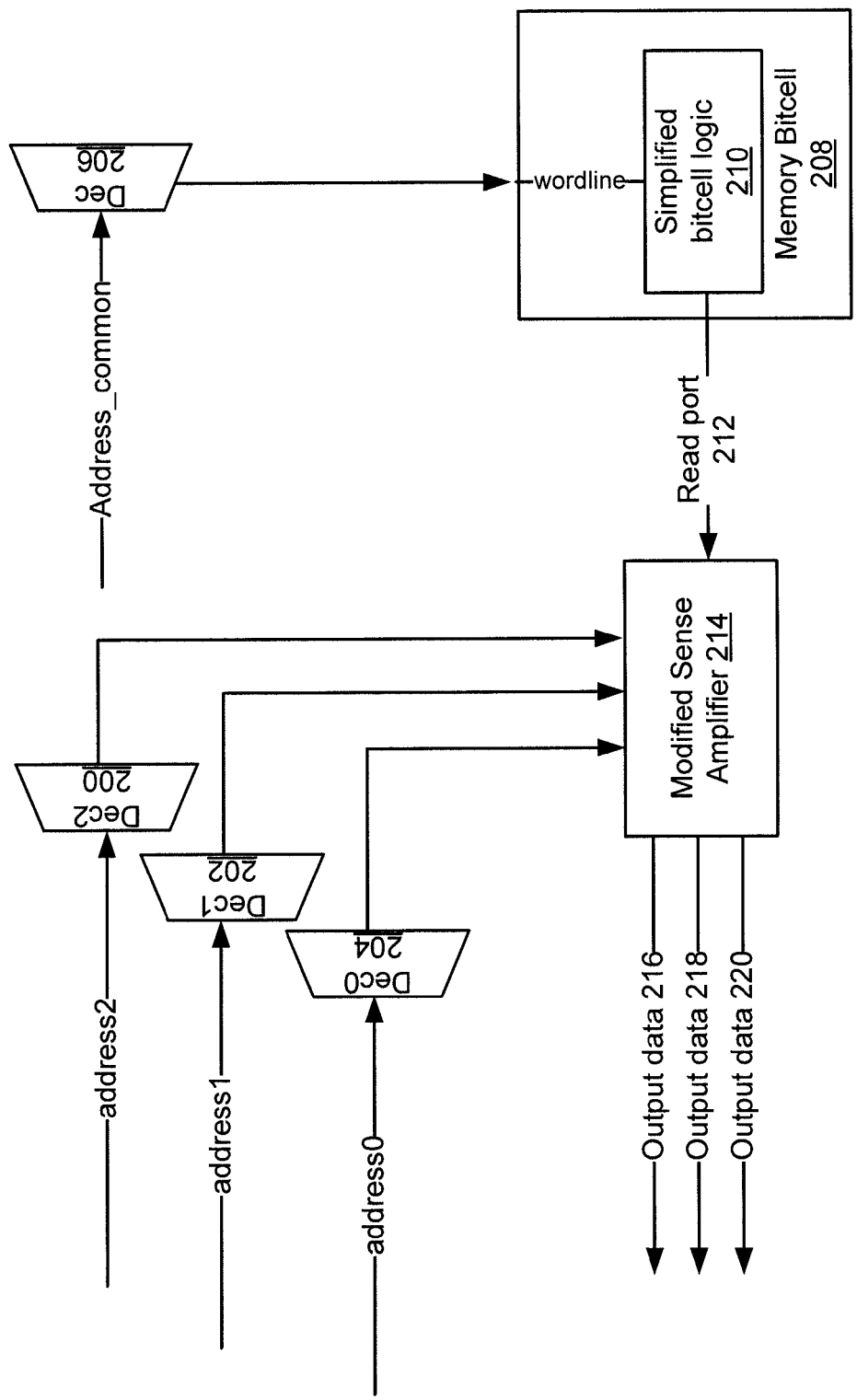
FIG. 2 shows schematics for an improved memory cell hardware arrangement in accordance with one or more embodiments of the invention.

FIG. 2 shows a schematic diagram of an improved hardware arrangement for a memory bitcell (208) in accordance with one or more embodiments of the invention. In FIG. 2, the memory bitcell (208) is simplified as the memory bitcell (208) takes a single input (wordline) and includes a single read port (212), as opposed to three inputs and three read ports. Specifically, in one or more embodiments of the invention, the memory bitcell includes multiple entries (not shown) for different physical addresses. Each entry stores data that is to be read by specifying the particular memory address for that entry. In the circuit of FIG. 2, for example, three memory addresses are to be read from, as represented by address°, address 1, and address2. Those skilled in the art will appreciate that while FIG. 2 shows three memory addresses (address0, address1, address2), there may be any number of memory addresses specified from which data is to be read. Each of the three memory addresses has a portion of the address that is common to each of the three memory addresses. Embodiments of the invention place a limitation such that specified memory addresses from which data is to be read must contain an identical portion that is a common memory address portion (Address_common), which is decoded separately from uncommon memory address portion.

In one or more embodiments of the invention, instead of fully decoding each of the addresses, certain bits of the address may be common. For example, consider the scenario in which there are a total of 6 bits of the memory address, where 3 of those 6 bits are common. Instead of performing a full 64-bit decode, embodiments of the invention perform a hierarchical decode in which the common 3 bits are decoded at a first decoding level, and the remaining bits are decoded at a second decoding level. Thus, specifically in FIG. 2, the common memory address portion (address_common) is decoded by Dec (206) and sent as input to the memory bitcell (208). The uncommon portions of each of the memory addresses from which data is to be read are decoded using a corresponding decoder (e.g., Dec0 (204) for address0, Dec1 (202) for address1, and Dec2 (200) for address2).

The simplified bit cell logic (210) is used to determine which entry within the memory bitcell (208) corresponds to the decoded common memory address portion. The data from that entry is output on the read port (212) to the modified sense amplifier (214). The modified sense amplifier (214) may be a local sense amplifer (LSA) or a global sense amplifer (GSA). A LSA operates on local data or I/O lines and a GSA operates on global data or I/O lines. The modified SA (214) is configured to amplify the voltage signal given off by the output on the read port (212) as the signal is otherwise weak.

In one or more embodiments of the invention, the modified SA (214) is also configured to accept, as input, the decoded uncommon portions of each of the memory addresses. Thus, the modified SA (214) includes additional input capability to accept the decoded uncommon memory address portions directly from the decoder(s) (200, 204, 206). The modified SA (214) is configured to output data (216, 218, 220) corresponding to the data output on the memory bitcell read port (212) when at least one of the decoded uncommon memory address portions enables the modified SA (214). The modified SA (214) may output multiple output data (216, 218, 220), corresponding to the number of memory addresses directly fed into the modified SAs, as shown in FIG. 2, or there may be multiple modified SAs each with functionality to output a single output data.

Those skilled in the art will appreciate that the memory bitcell shown in FIG. 2 may be one of a plurality of memory bitcells or register banks of a memory chip. That is, the hardware arrangement shown in FIG. 2 may be replicated for a plurality of memory/register banks, each which may be operatively connected to a corresponding modified SA. Those skilled in the art will further appreciate that the hardware arrangement shown in FIG. 2 allows for the reduction of read ports in the memory cell from 3 read ports to a single read port, because the memory bitcell is only receiving the decoded common memory address portion and outputting the data stored in the entry corresponding to the decoded common memory address portion. The remainder of the memory address is used at a second level to enable one or more modified SAs for outputting data. Reduction of ports, in turn, results in a reduction of area and power of the memory bit cell. Accordingly, in embodiments of the invention, virtual porting (or emulation of a read port) is performed at the local or global sense amplifier level.

The improved hardware arrangement described above in FIG. 2 may apply to any multi-port fast storage type, such as for example, SRAM, DRAM, or any other suitable memory type that has some common address portion among the read ports. Further, embodiments of the invention may be implemented in floating point register files (FRFs) or any other suitable register file with register banks.

Those skilled in the art will appreciate that embodiments of the invention apply to scenarios in which there is a common portion among each of the memory addresses to be read. That is, a limitation is placed on embodiments of the invention such that the same entry is read from each register bank/memory bitcell of the memory chip.

Figure 3:
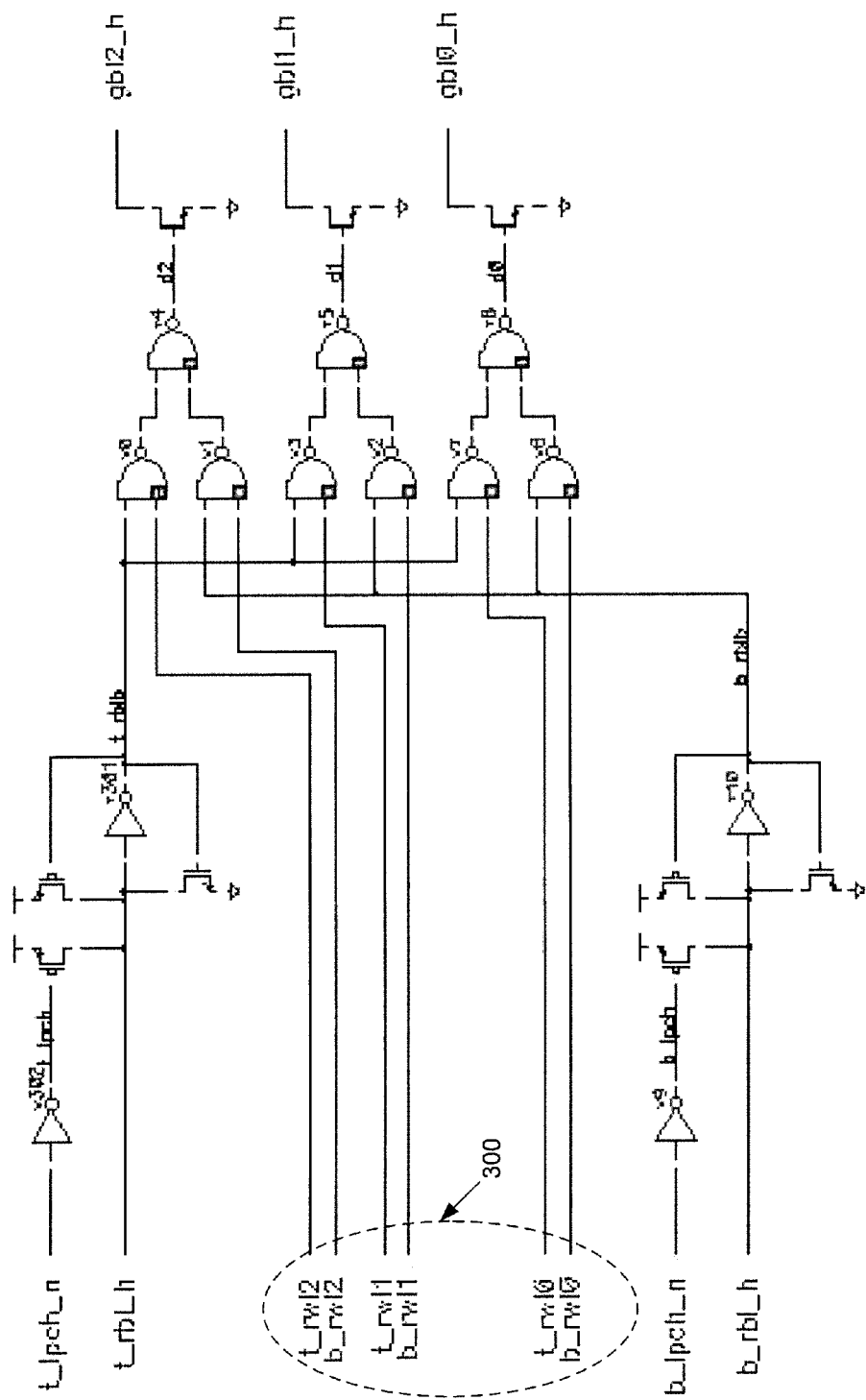
FIG. 3 shows schematics for a modified sense amplifier in accordance with one or more embodiments of the invention.

FIG. 3 shows a schematic diagram of a modified SA in accordance with one or more embodiments of the invention. In particular, the diagram of FIG. 3 shows a local sense amplifier (LSA) modified in accordance with embodiments of the invention. Those skilled in the art will appreciate that while the schematic shows a single modified LSA, there may be more than one modified LSA employed in embodiments of the present invention. As described above, embodiments of the invention are implemented using a modified LSA, which includes functionality of a traditional local sense amplifier, as well as additional input capability as shown by reference 300 in FIG. 3. Such a modified LSA may be operatively connected to a register bank (memory bitcell) and is configured to output data corresponding to the register bank entry that is selected using the common memory address portion. The additional input capability of the modified LSA is configured to accept the decoded uncommon memory address portion of each of the memory addresses from which data is to be read directly. The decoded uncommon memory address portions are used to selectively enable one or more modified sense amplifiers (described below in FIGS. 4-5).

Figure 4:
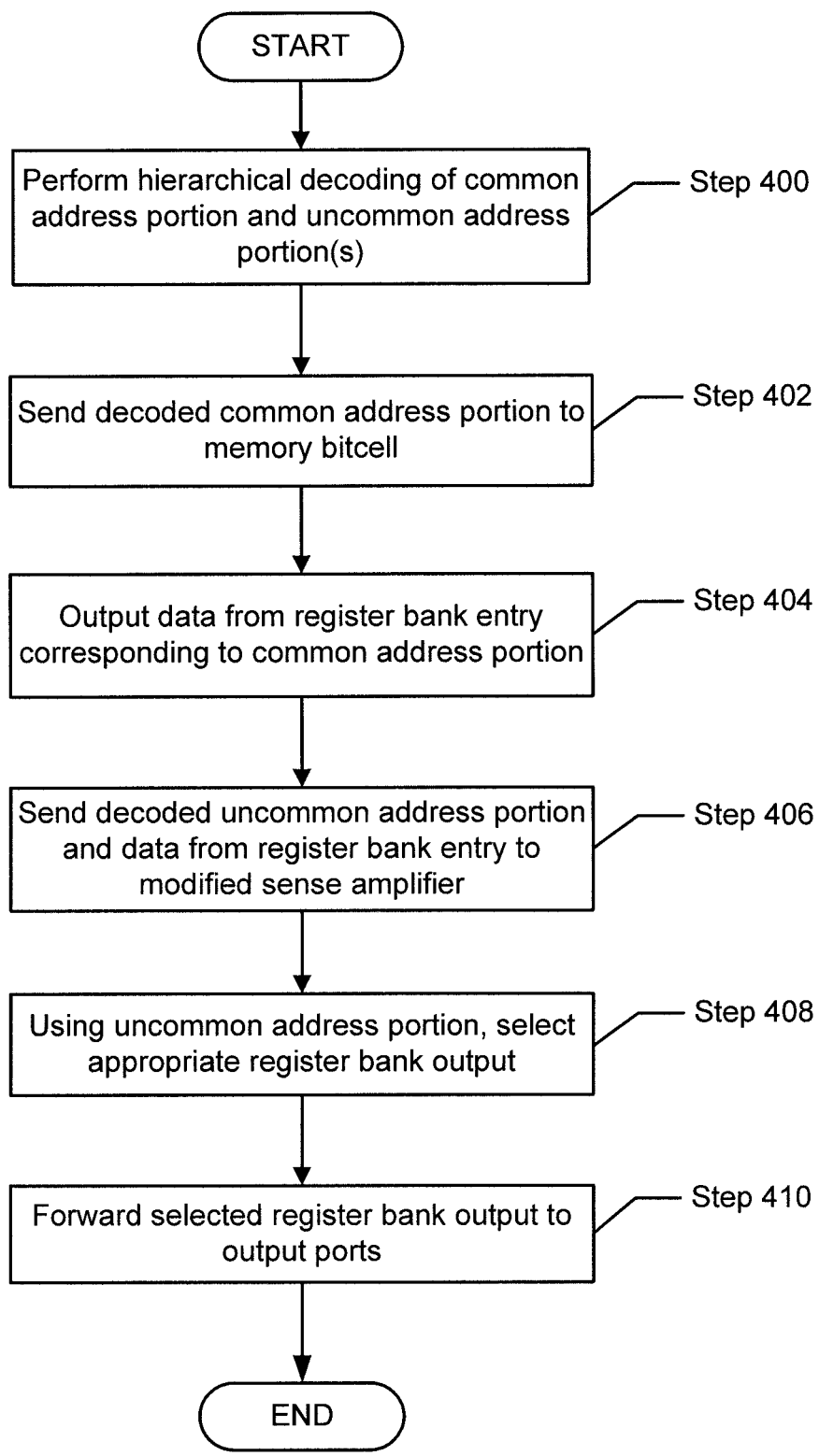
FIG. 4 shows a flow chart for performing embodiments of the invention in accordance with one or more embodiments of the invention.

FIG. 4 shows a flow chart for performing a method in accordance with embodiments of the invention. Specifically, FIG. 4 describes a method of reading data from memory bitcells with a single read port. For the description of FIG. 4, consider the scenario in which three 6-bit memory addresses need to be read, with three bits of each of the three memory addresses being common/identical. Consider also that, in the example and for illustration purposes only, the memory is a 64 entry memory chip, with 8 memory banks (register banks), each with 8 entries in it containing data. That is, the 64 entry memory includes 8×8 register banks. This scenario is an example used to illustrate the method of the present invention, and should not be construed to limit embodiments of the invention. The invention may be applied to any length of memory addresses, with the only caveat being that each of the memory address from which data is to be read must have a common portion that is identical.

Initially, hierarchical decoding is performed (Step 400) such that the earlier available common three bits of each of the three memory addresses is decoded separately from the uncommon portions of the three memory addresses. That is, the common portion of the memory addresses is decoded using a single decoder, while each of the uncommon three bit portions of the three memory addresses is decoded using three separate decoders. Those skilled in the art will appreciate that the use of a single decoder to decode three of the six bits may be advantageous because it may result in using less area on the memory chip, power savings, improved timing, etc.

Next, the decoded common address portion is sent to each of the eight memory banks in the 64 bit entry memory (Step 402). Thus, the three common bits among the three memory addresses, in decoded form, is sent to each memory bank as a single input to each memory bank. In one or more embodiments of the invention, this decoded common portion of the address is used to select a single entry in each memory bank. Said another way, the common address portion of each of the three addresses to be read results in selection of the same entry from each register bank. More specifically, the first level of decoding is replicated for each register bank within the memory chip. Second level decode (i.e., the decoding of the uncommon memory address portion) is indexed to select the data output from appropriate register banks, and this decoded address portion is more like a physical index. Thus, suppose for example that the decoded common portion results in 001, which represents the number 1 in binary. In this case, entry 1 is selected in each of the eight register banks, and the data stored in entry 1 of each register bank is output on the single read port of each of the register banks by the decoded common portion of the memory address (Step 404).

Those skilled in the art will appreciate that the common portion of each of the memory addresses to be read from (regardless of how many memory addresses there are) is of a fixed width (in this example, 3 bits) and may be either the most significant bits (MSBs) or the least significant bits (LSBs) of each of the memory addresses. Those skilled in the art will also appreciate that the requirement that each of the memory address to be read from must have an identical common portion results in the same entry being selected from each memory bitcell/register bank.

At this stage, the decoded uncommon memory address portion is sent directly to the modified sense amplifier (SA) (Step 406). In addition, the data stored in each of the same register bank entries is also sent to the corresponding modified SA (Step 406). As described above, the modified SA includes additional input capability to accept the decoded uncommon memory address portion(s) as direct input. Continuing with the above example, for Step 406, the data from each of the 8 register banks is sent via the single read port from the register bank to a corresponding modified SA. Thus, there are 8 modified SAs operatively connected to each of the register banks. In addition, the decoded uncommon memory address portions of each of the three memory addresses to be read from is also sent to each of the modified SAs.

Next, a determination is made as to whether the modified SA is enabled to output the data from the register bank entry using the plurality of uncommon address portions. That is, when multiple register banks output data from the same position/entry in each register bank to multiple modified SAs, the uncommon address portion is used to select the appropriate register bank output by enabling only those modified SAs to produce an output that correspond to the decoded uncommon address portions (Step 408). While 8 different output data are sent to 8 different modified SAs from each of the register banks, the decoded uncommon memory address portions are used to enable only the modified SAs that correspond to the register bank outputs that are desired. In this example, three of the eight modified SAs that correspond to each of the three decoded uncommon memory address portions are enabled, and the data sent to the enabled three modified SAs is forwarded on the output ports of the modified SAs (Step 410).

Thus, in effect, the modified SA is used for both amplifying the voltage of the memory data output, as well as for multiplexing to select the register bank entries that correspond to the memory addresses desired to be read.

Figure 5:
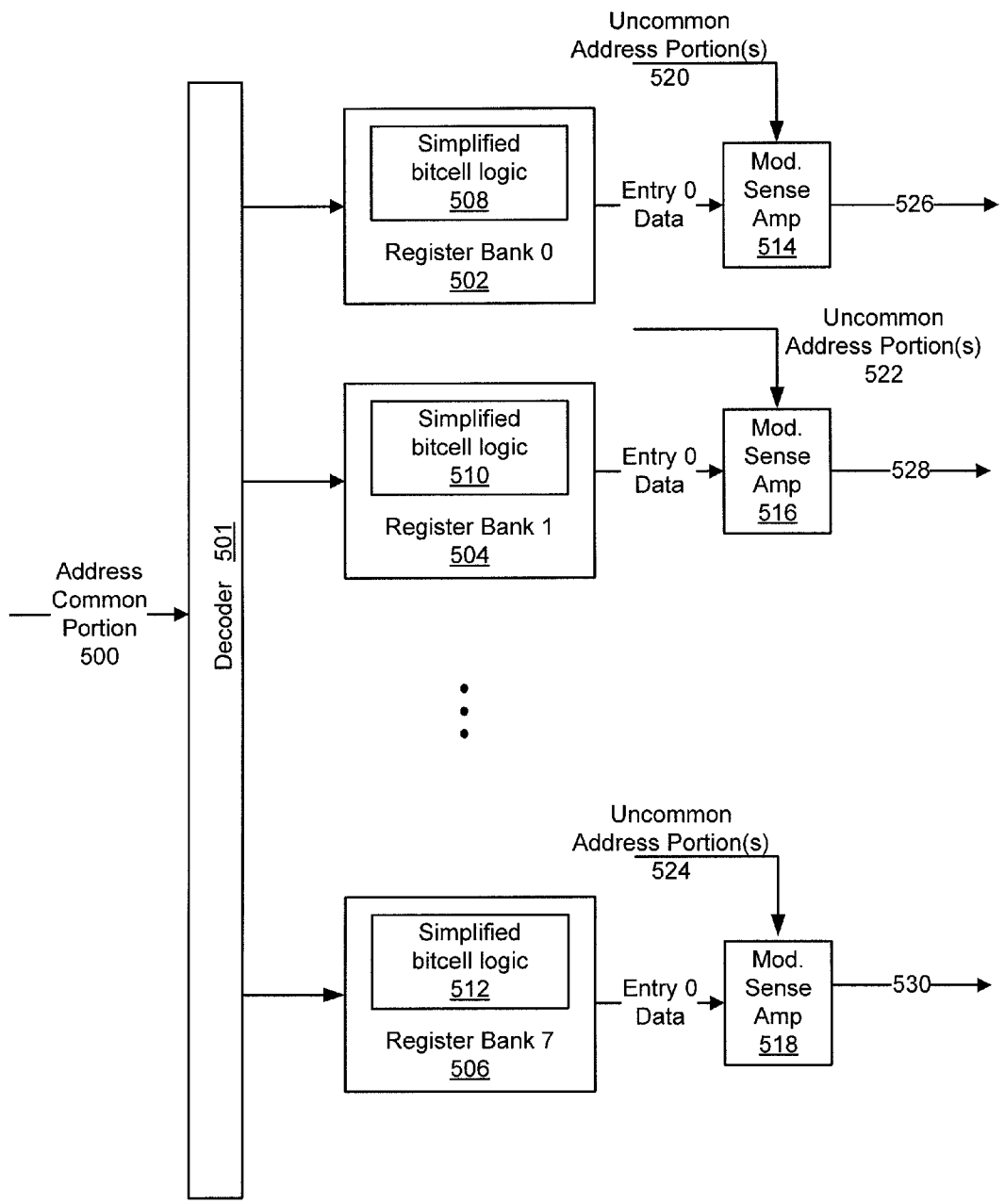
FIG. 5 shows an example of implementing one or more embodiments of the invention.

FIG. 5 shows a flow diagram for the example described above with respect to FIG. 4. Thus, in FIG. 5, the common address portion (500) of each of the memory addresses from which data is to be read is decoded in decoder (501) and sent to each of register banks 0-7 (502, 504, 506). The simplified bit cell logic (508, 510, 512) in each of the register banks 0-7 (502, 504, 506) is used to select the memory address line corresponding to the decoded common memory address portion. This results in the same entry (entry 0, for example) from each of the register banks 0-7 (502, 504, 506) being selected, as dictated by the decoded common address portion. Entry 0 is used solely for purposes of illustration and may be any entry 0-8 from each of register banks 0-7 (502, 504, 506), as long as the entry selected is the same for each register bank. Said another way, the data stored at the same position within each register bank is selected using the decoded common memory address portion. Each of these entries are output via the single read port of each of the register banks 0-7 (502, 504, 506) to a corresponding one of eight modified SAs (514, 516, 518). In addition, the modified SAs (514, 516, 518) are configured to receive, directly, the decoded bits of the three uncommon memory address portions (520, 522, 524). Of the eight modified SAs (514, 516, 518), the three corresponding to the bits of the three uncommon memory address portions (520, 522, 524) are enabled, and the data stored in entry 0 for the three enabled modified SAs is the data that eventually gets forwarded onto the output ports (526, 528, 530) of the modified SAs.

Thus, for example, if the uncommon portions of the three memory addresses are decoded to one, two, and three, represented in binary as 001, 010, and 011, the first, second, and third (or the three modified local or global SAs corresponding to one, two, and three) modified SAs are enabled, and data from entry 0 from register bank 0, register bank 1, and register bank 2 is output via the modified SAs. Accordingly, the common address portion is used to select data stored at the same position in each register bank (where the data at each position may be different), and the uncommon address portion is used to select which of the modified SAs are enabled and output a result. Those modified SAs that do not correspond to the decoded uncommon memory address portions remain inactive and do not output data.

Embodiments of the invention are directed to an efficient method for reading data from memory addresses that have a portion of the address in common that results in a reduction of area occupied by each multi-port memory chip. In addition, there are considerable power and timing savings as well. Because all three data outputs are read from same thread, a full address decode becomes unnecessary, and a common thread ID (the common memory address portion) is the only part of the memory address that is sent to the memory bitcell. This allows for two read ports to be removed from each memory bitcell, which reduces area, even though the modified sense amplifier area increased due to the additional input capability added. The local bitline is discharged less, resulting in a reduction of power consumption.

Furthermore, embodiments of the invention may also be applied to a multi-port memory where only certain (but not all) read ports have common address, e.g. 3 out of 4 read ports may share a common address portion, in which case the 4 port memory bitcell may be reduced to a 2 read port memory bitcell.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A hardware arrangement for a memory bitcell, comprising:
    a primary decoder configured to decode a common memory address portion among a plurality of memory addresses to obtain a decoded common memory address portion;
    a plurality of secondary decoders each configured to decode an uncommon memory address portion of each of the plurality of memory addresses to obtain a plurality of decoded uncommon memory address portions;
    the memory bitcell configured to receive the decoded common memory address portion and output data from a memory entry corresponding to the decoded common memory address portion, wherein the memory bitcell comprises a single read port for outputting the data; and
    a modified sense amplifier (SA) configured to:
        receive the data output on the single read port of the memory bitcell, and
        directly receive the plurality of decoded uncommon memory address portions, wherein the plurality of decoded uncommon memory address portions is used to determine whether to enable the modified SA, wherein the data output from the memory bitcell is forwarded by the modified SA when the modified SA is enabled.

2. The hardware arrangement of claim 1, wherein the common memory address portion is one of the most significant bits of the plurality of memory addresses or the least significant bits of the plurality of memory addresses.

3. The hardware arrangement of claim 1, wherein the modified SA comprises additional input capability to receive the plurality of decoded uncommon memory address portions.

4. The hardware arrangement of claim 1, wherein the memory bitcell is one selected from a group consisting of SRAM and DRAM.

5. The hardware arrangement of claim 1, wherein the modified SA is one selected from a group consisting of a local sense amplifier and a global sense amplifier.

6. A method for reading memory, comprising:
    performing hierarchical decoding of common address portion and uncommon address portions of a plurality of memory addresses to obtain a decoded common address portion and a plurality of decoded uncommon address portions of each of the plurality of memory addresses from which data is to be read;
    sending the decoded common address portion to a memory bitcell;
    obtaining data from a memory bitcell entry corresponding to the decoded common memory address portion, wherein the data is output via a single read port of the memory bitcell;
    sending the data and the decoded uncommon address portions to a modified sense amplifier (SA); and
    determining whether the modified SA is enabled to output the data using the plurality of uncommon address portions.

7. The method of claim 6, further comprising:
    sending the decoded common address portion to a plurality of memory bitcells;
    obtaining data from a same entry in each of the plurality of memory bitcells, wherein the same entry in each memory bitcell corresponds to the decoded common memory address portion, wherein the data is output via a single read port of each of the plurality of memory bitcells;
    sending the data from each single read port and the plurality of decoded uncommon address portions to a corresponding one of a plurality of modified sense amplifiers (SAs); and
    enabling a subset of the plurality of modified SAs based on the plurality of decoded uncommon address portions, wherein data is output by only the enabled subset of modified SAs.

8. The method of claim 6, wherein the common memory address portion is one of the most significant bits of the plurality of memory addresses or the least significant bits of the plurality of memory addresses.

9. The method of claim 7, wherein each of the modified SAs comprises additional input capability to receive the plurality of decoded uncommon memory address portions.

10. The method of claim 6, wherein the memory bitcell is one selected from a group consisting of SRAM and DRAM.

11. The method of claim 6, wherein the modified SA is one selected from a group consisting of a local sense amplifier and a global sense amplifier.

* * * * *

UNITED STATES PATENT AND TRADEMARK OFFICE
CERTIFICATE OF CORRECTION

PATENT NO. : 8,130,587 B1  
APPLICATION NO. : 12/871450  
DATED : March 6, 2012  
INVENTOR(S) : Liu et al.

Page 1 of 1

It is certified that error appears in the above-identified patent and that said Letters Patent is hereby corrected as shown below:

On Title page, in column 1, under "Title", line 1, delete "REPLICATE" and insert -- REPLICATING --, therefor.

In column 1, line 1, delete "REPLICATE" and insert -- REPLICATING --, therefor.

In column 3, line 10, delete "addresso°," and insert -- address0, --, therefor.

In column 3, line 43, delete "amplifer" and insert -- amplifier --, therefor.

In column 3, line 43-44, delete "amplifer" and insert -- amplifier --, therefor.

In column 4, line 1, delete "each" and insert -- each of --, therefor.

Signed and Sealed this  
Twenty-ninth Day of May, 2012

David J. Kappos  
*Director of the United States Patent and Trademark Office*